(12) United States Patent
Liang et al.

(10) Patent No.: US 9,379,261 B2
(45) Date of Patent: Jun. 28, 2016

(54) ULTRA THIN FILM NANOSTRUCTURED SOLAR CELL

(71) Applicant: The Board of Trustees of the Leland Stanford Junior University, Palo Alto, CA (US)

(72) Inventors: Dong Liang, San Jose, CA (US); Yijie Huo, Cupertino, CA (US); Yangsen Kang, Stanford, CA (US); James S. Harris, Jr., Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 13/963,419

(22) Filed: Aug. 9, 2013

(65) Prior Publication Data

US 2014/0041717 A1   Feb. 13, 2014

Related U.S. Application Data

(60) Provisional application No. 61/681,570, filed on Aug. 9, 2012.

(51) Int. Cl.
 *H01L 31/0352* (2006.01)
 *H01L 31/18* (2006.01)
 *H01L 31/0236* (2006.01)

(52) U.S. Cl.
 CPC .. *H01L 31/035281* (2013.01); *H01L 31/02363* (2013.01); *H01L 31/02366* (2013.01); *H01L 31/1896* (2013.01); *Y02E 10/50* (2013.01)

(58) Field of Classification Search
 CPC ............. H01L 31/035281; H01L 31/1896; H01L 31/02363; H01L 31/02366
 See application file for complete search history.

(56) References Cited

U.S. PATENT DOCUMENTS

| 4,214,918 | A | * | 7/1980 | Gat | ........... | H01L 21/321 148/DIG. 93 |
| 5,053,083 | A | * | 10/1991 | Sinton | ............. | H01L 3/03529 136/255 |
| 6,384,318 | B1 | * | 5/2002 | Nomura | ............. | H01L 31/0236 136/246 |
| 6,580,026 | B1 | * | 6/2003 | Koyanagi | ............. | H01G 9/2009 106/285 |
| 7,022,910 | B2 | * | 4/2006 | Gaudiana | ............. | H01G 9/2031 136/244 |
| 7,754,964 | B2 | | 7/2010 | Kempa et al. | | |
| 2004/0118448 | A1 | * | 6/2004 | Scher et al. | ............. | 136/252 |
| 2005/0016583 | A1 | * | 1/2005 | Blieske | ............. | C03C 17/23 136/256 |
| 2006/0090790 | A1 | * | 5/2006 | Kobayashi | ............. | H01L 31/02168 136/256 |

(Continued)

OTHER PUBLICATIONS

Ferry et al., "Solar cells from earth-abundant semiconductors with plasmon-enhanced light absorption", May 2010.

(Continued)

*Primary Examiner* — Golam Mowla
(74) *Attorney, Agent, or Firm* — Lumen Patent Firm

(57) ABSTRACT

Improved solar cells are provided by nano-structuring the solar cell active region to provide high optical absorption in a thin structure, thereby simultaneously providing high optical absorption and high carrier collection efficiency. Double-sided nano-structuring is considered, where both surfaces of the active region are nano-structured. In cases where the active region is disposed on a substrate, nano-voids are present between the substrate and the active region, as opposed to the active region being conformally disposed on the substrate. The presence of such nano-voids advantageously increases both optical and electrical confinement in the active region.

8 Claims, 9 Drawing Sheets

(56) References Cited

U.S. PATENT DOCUMENTS

| | | | |
|---|---|---|---|
| 2006/0137735 A1* | 6/2006 | Kobayashi | G02F 1/133504 136/246 |
| 2006/0207647 A1* | 9/2006 | Tsakalakos | B82Y 20/00 136/256 |
| 2007/0151596 A1* | 7/2007 | Nasuno | H01L 31/022466 136/256 |
| 2007/0175507 A1* | 8/2007 | Dutta | H01L 31/035209 136/255 |
| 2008/0185036 A1* | 8/2008 | Sasaki | H01L 31/02168 136/252 |
| 2010/0043859 A1* | 2/2010 | Aranami | C25B 1/003 136/244 |
| 2010/0132780 A1* | 6/2010 | Kizilyalli | H01L 31/0236 136/255 |
| 2010/0240167 A1 | 9/2010 | Dasgupta et al. | |
| 2012/0006390 A1 | 1/2012 | Huo et al. | |
| 2012/0286389 A1 | 11/2012 | Gu et al. | |
| 2013/0008497 A1 | 1/2013 | Smirnov et al. | |

OTHER PUBLICATIONS

Zhu et al., "Nanodome solar cells with efficient light management and self-cleaning", Nov. 5, 2009, pp. 1979-1984, Nano Lett. v10.

Schermer et al., "Photon confinement in high-efficiency, thin-film III-V solar cells obtained by epitaxial lift-off", Jan. 19, 2006, pp. 645-653, Thin Solid Films 511-512.

Yoon et al., "GaAs photovoltaics and optoelectronics using releasable multilayer epitaxial assemblies", 2010, pp. 329-333, Nature v 465.

Liang et al. "GaAs thin film nanostructure arrays for III-V solar cell applications", Feb 9, 2012, Proc SPIE 8269.

Liang et al. "Optical Absorption Enhancement in Freestanding GaAs Thin Film Nanopyramid Arrays", May 31, 2012, Adv. Energy Mater. v2 pp. 1254-1260.

* cited by examiner

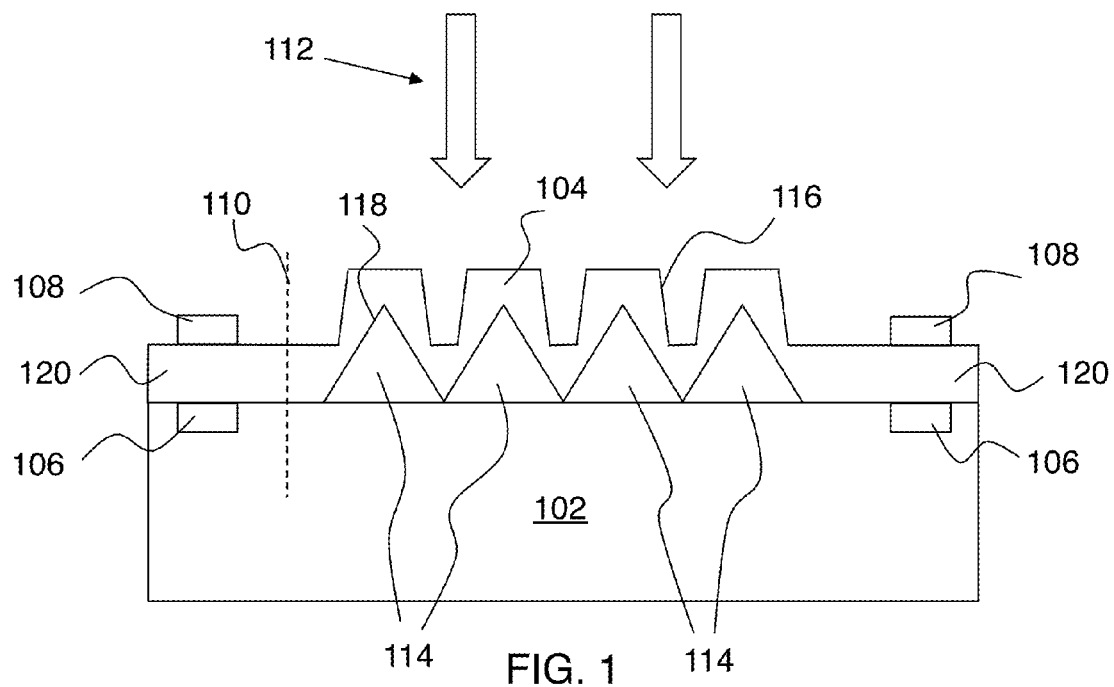
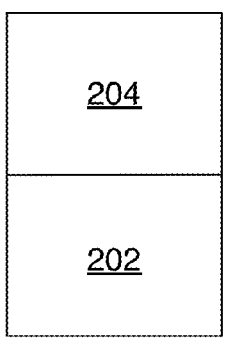
FIG. 2A
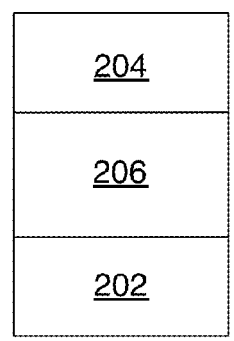
FIG. 2B
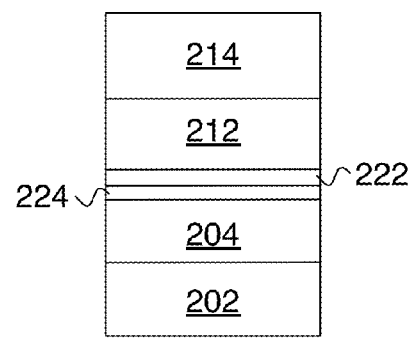
FIG. 2C

US 9,379,261 B2

ULTRA THIN FILM NANOSTRUCTURED SOLAR CELL

CROSS REFERENCE TO RELATED APPLICATIONS

This application claims the benefit of U.S. provisional patent application 61/681,570, filed on Aug. 9, 2012, and hereby incorporated by reference in its entirety.

FIELD OF THE INVENTION

This invention relates to solar cells.

BACKGROUND

Solar cells have been extensively investigated for many years, with a major emphasis on increasing efficiency and reducing cost. One approach that has been considered for improving solar cell performance is the use of nano-structuring in solar cells. Examples include the nano-coax structures of U.S. Pat. No. 7,754,964 and the nano-pillars and nano-cones of US 2010/0240167. However, there are aspects of nano-structured solar cells that do not appear to have been appreciated in the art.

SUMMARY

In a solar cell, electromagnetic radiation is absorbed to provide electrical power. Because of this, it is important to ensure that the incident electromagnetic radiation is absorbed with high efficiency in the active region of the device. Here, all layers that are important for basic device operation (i.e., the layers where radiative generation of electrons and holes is significant) are collectively defined to be the "active region" of the solar cell. Thus, the active region excludes basically inert structures such as substrates for mechanical support, anti-reflection coatings etc.

In conventional solar cells, this active region tends to be relatively thick, in order to provide sufficient absorption of incident radiation. For example, conventional silicon solar cells often have active region thicknesses on the order of 100 µm. However, the density of photo carriers undesirably decreases as the active region thickness increases, which can undesirably decrease the open circuit voltage. Thus, conventional solar cell layer thicknesses are determined by a tradeoff between increased optical absorption (thick layers) and increased carrier density (thin layers).

The present approach is based on using nano-structuring of the solar cell active region to provide high optical absorption in a thin structure, thereby significantly improving solar cell performance compared to the conventional case where the above-described thickness tradeoff is needed. More specifically, double-sided nano-structuring is considered, where both surfaces of the active region are nano-structured. In cases where the active region is disposed on a substrate (e.g., for mechanical support), nano-voids are present between the substrate and the active region, as opposed to the active region being conformally disposed on the substrate. The presence of such nano-voids advantageously increases both optical and electrical confinement in the active region.

When the thin film thickness gets down to the range of one or two orders of magnitude lower than absorption length of the planar film, the absorption enhancement factor can be 5 or more, is preferably 10 or more, and is more preferably 100 or more. Here the enhancement factor is typically defined with reference to integrated absorption over the solar spectrum, as opposed to absorption at a single wavelength.

We have found that the use of such nano-structuring allows solar cell active region thicknesses to be significantly decreased (e.g., for Si solar cells, this thickness can be reduced to roughly 2 µm or less) without significantly reducing optical absorption. For GaAs solar cells, the active region thickness can be decreased to 200 nm or less. In general, this approach allows the active region thickness to be decreased to less than $0.1 L_a$, where $L_a$ is the bulk absorption length of the solar cell material. Here $L_a$ can be averaged appropriately over the solar spectrum. Furthermore, such ultra-thin solar cells can advantageously provide an increased open-circuit voltage relative to comparable solar cells with thicker active regions. This approach is applicable to any kind of solar cell (e.g., single-junction cells, multi-junction cells, silicon solar cells, elemental semiconductor solar cells, compound semiconductor solar cells, etc.). By reducing the total amount of semiconducting material required for an efficient solar cell, the solar cell cost can be significantly reduced without compromising efficiency. The present approach is suitable for use with low cost fabrication methods at a large scale, which can further reduce cost.

BRIEF DESCRIPTION OF THE DRAWINGS

FIG. 1 shows an exemplary embodiment of the invention.

FIGS. 2A-C show exemplary active region structures suitable for use in embodiments of the invention.

DETAILED DESCRIPTION

Figure 3A:
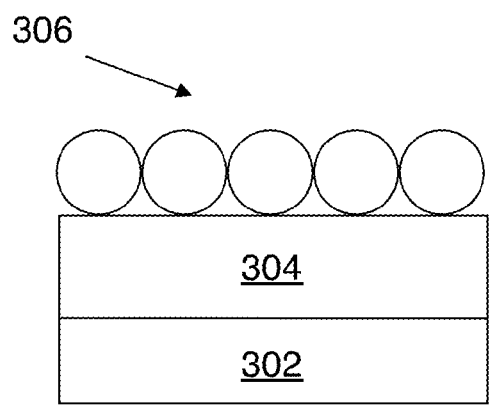
FIGS. 3A-G show an exemplary fabrication sequence.

FIG. 1 shows an exemplary embodiment of the invention. In this example, a solar cell active region 104 has opposing first and second surface zones (116 and 118, respectively) that are both nano-structured. Here, nano-structuring is defined as providing features having lateral and/or vertical dimensions of 1 micron or less. Active region 104 is a multilayer structure including one or more crystalline semiconductors, as described in greater detail below in connection with FIGS. 2A-C. Active region 104 is disposed on a substrate 102 such that nano-voids 114 are formed between the active region and the substrate. The multilayer structure in active region 104 includes at least a p-doped layer and an n-doped layer and is capable of providing electrical power when illuminated with optical radiation 112.

In the example of FIG. 1, active region 104 includes a contact zone 120 for making electrical contact to the active region, where the contact zone is laterally adjacent to the nano-structured first and second surface zones (116 and 118) of the active region. Contact zone 120 is not nano structured, thereby permitting top contacts 108 and bottom contacts 106 to be made to the active region using conventional techniques. To maximize current collection efficiency, contact zone 120 and/or contacts 106, 108 can laterally surround the nanostructured first and second surface zones of the active region. This approach for making electrical contact to a nano-structured active region is described for illustrative purposes. Any other approach for making such electrical contact can also be employed.

An important feature of the present approach is the capability of providing high optical absorption in a thin film. For an active region composed of material having a bulk absorption 1/e length of $L_a$, the total thickness of the active region is preferably less than about 0.1 $L_a$, and is more preferably less than about 0.01 $L_a$. Such absorption lengths are preferably defined with respect to integrated absorption using a solar spectrum weighting function in the integration, as opposed to the absorption length at any specific single wavelength. For a silicon active region, the total thickness of the active region can be less than about 2 µm. For an active region of a direct band gap semiconductor (e.g., GaAs and some other compound semiconductors), the total thickness of the active region can be less than about 200 nm.

In the example of FIG. 1, the second surface zone 118 is nanostructured to have raised pyramidal features and the first surface zone 116 is nano-structured to have corresponding pyramidal depressions that align with the raised pyramidal features of the second surface zone. The resulting double-sided nano-structuring has hollow nano-pyramids in the active region.

As indicated above, such nano-structuring can provide high absorption in a thin active region. Furthermore, the presence of nano-voids 114 improves optical and electrical confinement in the structure. To better appreciate this point, the structure of FIG. 1 can be compared to a similar structure where regions 114 are taken to be regions of solid material (e.g., parts of substrate 102). By having voids 114 as opposed to solid regions 114, the refractive index contrast of nano-structuring 118 is increased, thereby desirably enhancing the effect of nano-structuring 118 on optical absorption. Another benefit of having voids 114 instead of solid regions 114 is that if light is absorbed in solid regions 114, the resulting carriers are likely to be lost rather than collected at the device terminals. Thus it is preferable to have no light absorbed in regions of poor carrier collection efficiency, which can be accomplished by having regions 114 be voids. Finally, having solid regions 114 present will also tend to reduce minority carrier density, thereby undesirably reducing open circuit voltage.

As indicated above, the present approach is suitable for use with any kind of solar cell active region. FIGS. 2A-C show some examples. The views of FIGS. 2A-C are cross section views through active region 104 along line 110 on FIG. 1. FIG. 2A shows an exemplary single junction structure, with a p-doped layer 202 and an n-doped layer 204. FIG. 2B shows an exemplary p-i-n structure, with a p-doped layer 202 and an n-doped layer 204 sandwiching an intrinsic layer 206. FIG. 2C shows an exemplary multi-junction structure, with a p-doped layer 202 and an n-doped layer 204 forming a first junction and a p-doped layer 212 and an n-doped layer 214 forming a second junction. A tunnel junction is provided by heavily n-doped layer 224 and heavily p-doped layer 222. The tunnel junction provides an Ohmic contact between the first and second junctions.

Practice of the invention does not depend critically on the crystalline semiconductors included in the active region. Suitable semiconductors include, but are not limited to: silicon, GaAs, elemental semiconductors, compound semiconductors, III-V semiconductors, and II-VI semiconductors. The active region can include homojunctions (i.e., adjacent p-doped and n-doped layers have the same composition) and/or heterojunctions (i.e., adjacent p-doped and n-doped layers have different compositions).

Figure 3B:
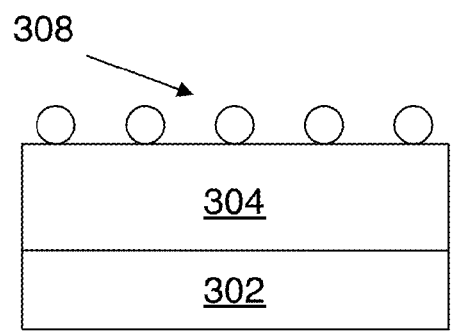
Figure 3C:
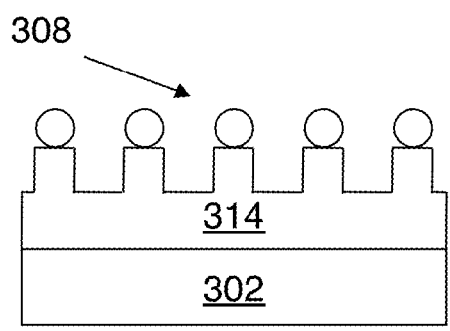
Figure 3D:
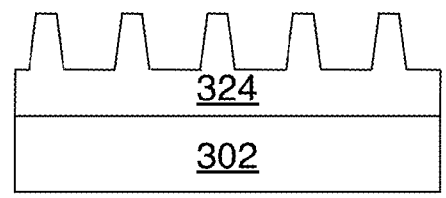
Figure 3E:
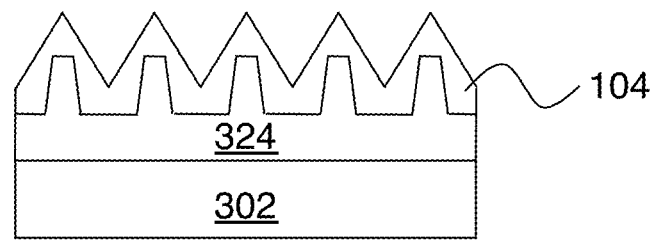

FIGS. 3A-G show an exemplary fabrication sequence. FIG. 3A shows close packed silica nanospheres 306 (650 nm diameter) disposed on a epitaxial Ge layer 304 on a silicon carrier layer 302. FIG. 3B shows the results of shrinking silica nanospheres 306 to provide reduced nanospheres 308. This step can be accomplished by using a plasma etch with $CHF_3$ gas that removes silica without removing Ge. FIG. 3C shows the result of applying a selective dry etch with $NF_3$ gas that removes Ge while not removing the reduced nanospheres 308. The resulting Ge layer 314 has a nanopillar structure. FIG. 3D shows the results of removing the reduced nanospheres 308, followed by etching the nano-pillar Ge layer 314 to provide a Ge nano-pyramid template layer 324. This step can be accomplished by a first selective chemical etch to remove the reduced nanospheres, followed by a second selective chemical etch that has different etch rates for different Ge crystal faces. FIG. 3E shows the result of epitaxially growing active region 104 on the template formed by Ge nano-pyramid layer 324. Such growth can be accomplished by any epitaxial growth technique, such as molecular beam epitaxy, metal-organic vapor phase epitaxy, atomic layer deposition, etc.

Figure 3F:
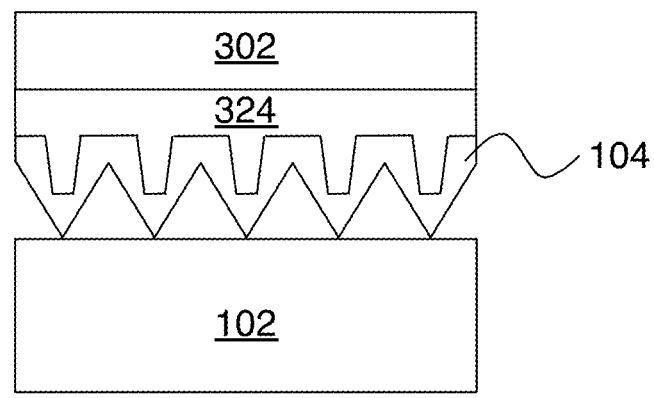
Figure 3G:
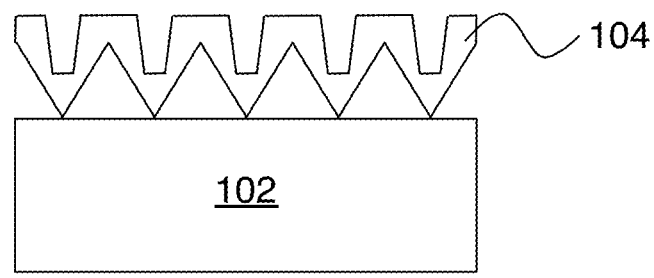

FIG. 3F shows the result of bonding active region 104 to a substrate 102 such that nano-voids are formed between the active region and the substrate. In this specific experiment, substrate 102 was PDMS (polydimethylsiloxane), which is adhesive. For non-adhesive substrates, conventional methods for wafer bonding can be used for this step. FIG. 3G shows the result of removing Ge template layer 324 and Si carrier layer 302 from the structure of FIG. 3F. This step can be accomplished with any etch that selectively removes layers 302 and 324 while not affecting active region 104. In this example, active region 104 is GaAs, and a $XeF_2$ dry etch is suitable for selectively removing layers 302 and 324.

Figure 4A:
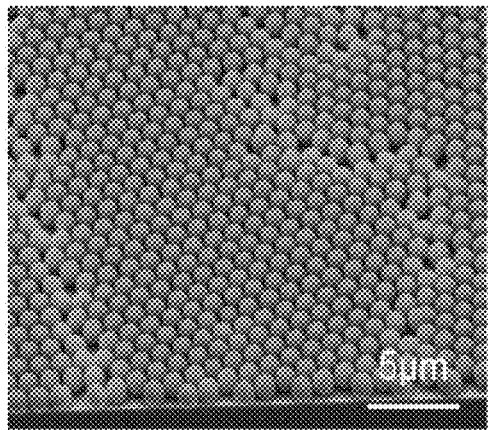
FIGS. 4A-H are images relating to the fabrication sequence of FIGS. 3A-G.
Figure 4B:
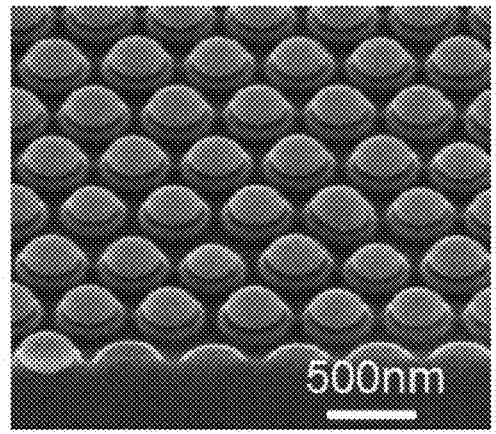
Figure 4C:
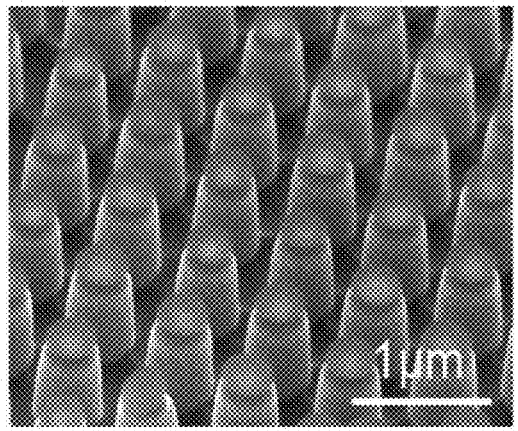
Figure 4D:
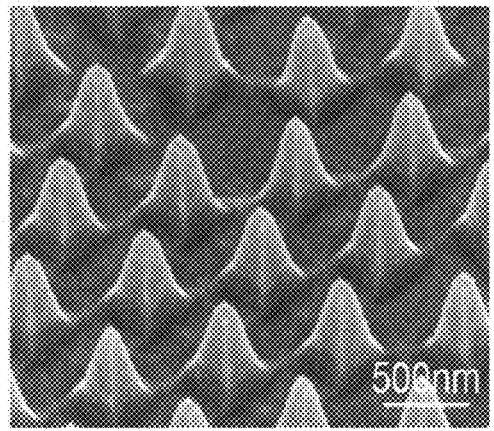
Figure 4E:
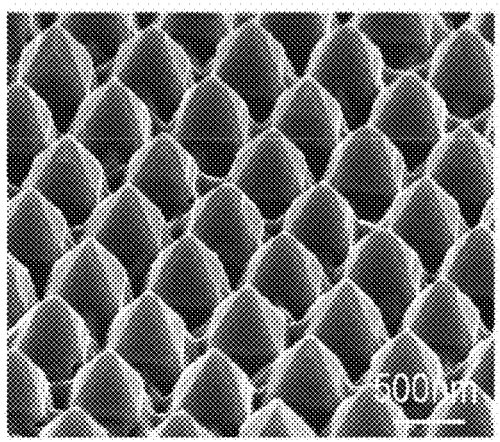
Figure 4F:
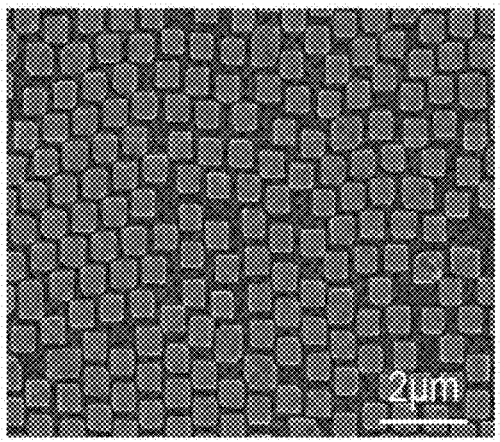
Figure 4G:
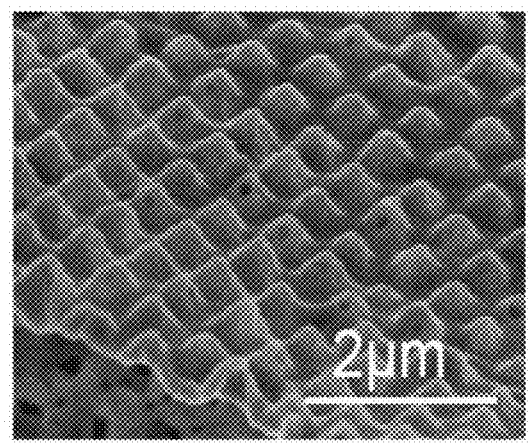
Figure 4H:
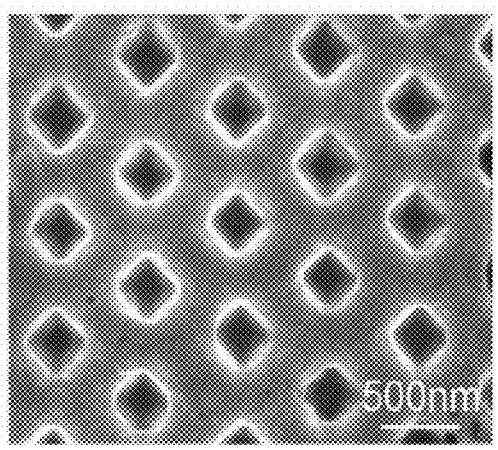

FIGS. 4A-H are images relating to the fabrication sequence of FIGS. 3A-G. FIG. 4A is an image of the configuration of FIG. 3A. FIG. 4B is an image of the configuration of FIG. 3B. FIG. 4C is an image of the configuration of FIG. 3C. FIG. 4D is an image of the configuration of FIG. 3D. FIG. 4E is an image of the configuration of FIG. 3E (45 degree view). FIG. 4F is an image of the configuration of FIG. 3E (top view). FIG. 4G is an image of a free standing GaAs hollow nano-pyramid film (e.g., 104 of FIG. 3G with no substrate 102). FIG. 4H is an image of the configuration of FIG. 3G (top view).

For the experiments described herein, the active region was a single layer of GaAs, and the substrate was PDMS (polydimethylsiloxane). Although this is not a suitable configuration for an operating solar cell, it was suitable for performing absorption measurements that prove the concept of high absorption in a thin nano-structured film.

Figure 5:
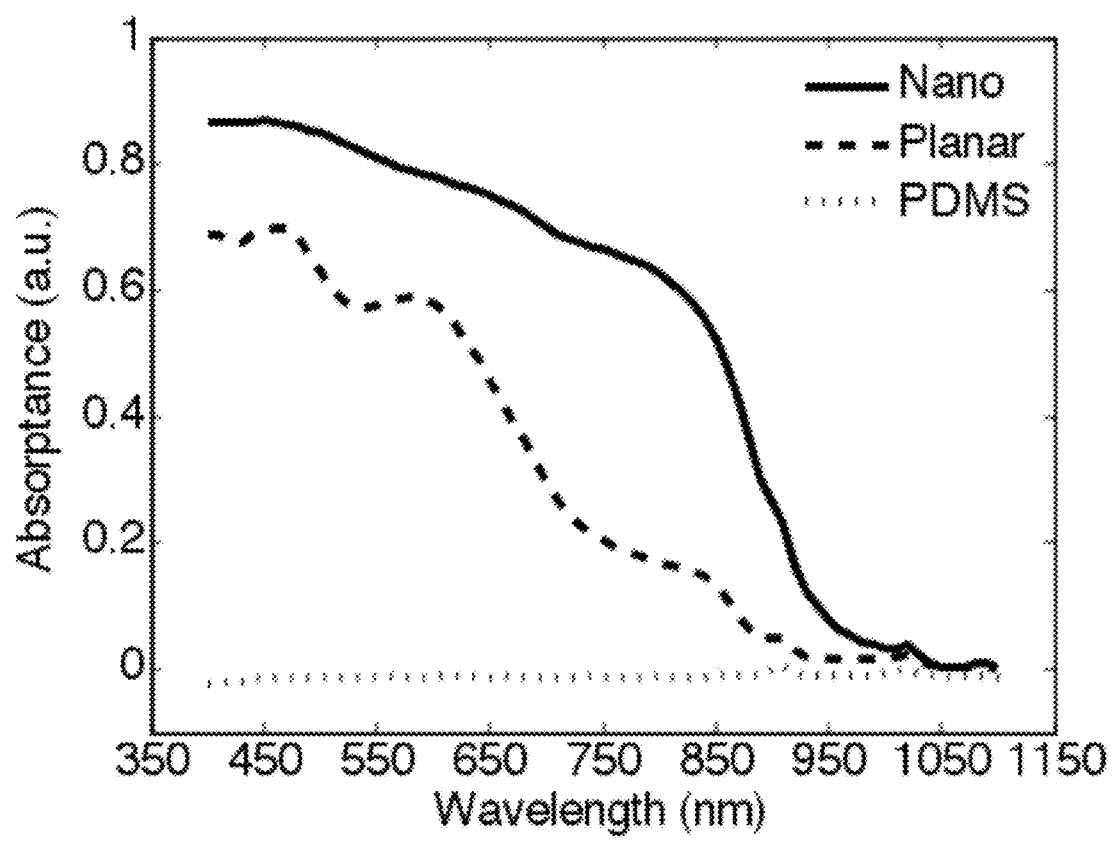
FIG. 5 shows an absorption spectrum of a thin nanostructured film compared to absorption spectra of reference structures.

FIG. 5 shows an absorption spectrum of a thin nanostructured film compared to absorption spectra of reference structures. In this figure, the 'PDMS' curve is from a control structure having only PDMS, the 'planar' curve is from a control structure having a planar GaAs film (160 nm thickness) on PDMS, and the 'nano' curve is from a nano-structured GaAs on PDMS sample fabricated as discussed above in connection with FIGS. 3A-G and 4A-H. This nano-structured active layer was GaAs and had an average thickness of 160 nm. It is clear that the nano-structured film absorbed significantly more than the planar film (100% or more increase), especially at relatively long wavelengths (i.e., 700 nm to 900 nm). This nano-structured film is optically equivalent to a 1 µm thick planar GaAs film.

Figure 6:
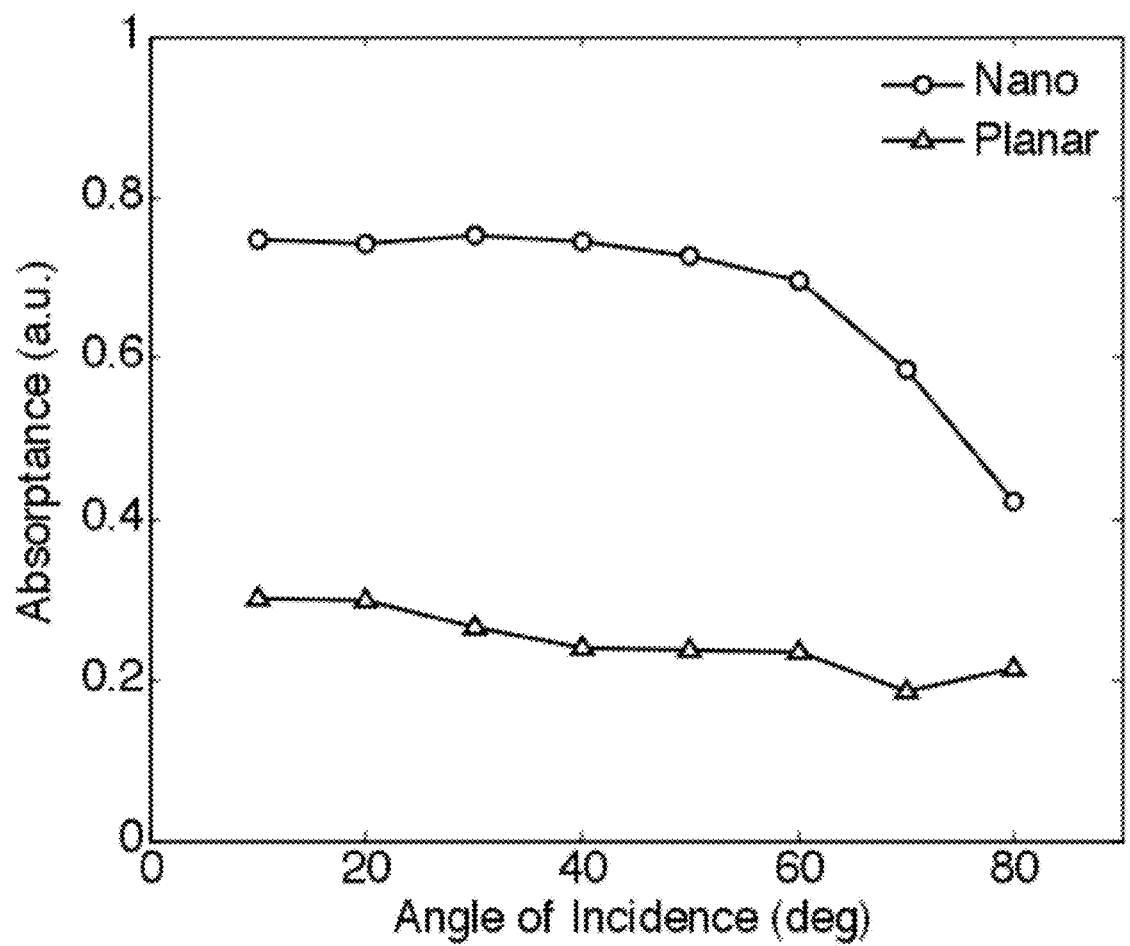
FIG. 6 shows measured angle dependence of absorption in a thin nanostructured film.

Another benefit of nano-structuring is high absorption over a broad range of incident angle. FIG. 6 shows measured angle dependence of absorption in a thin nanostructured film, at a wavelength of 700 nm. Here the 'nano' and 'planar' samples are as described above in connection with FIG. 5. From this figure, it is apparent that the nano-structured sample provides increased absorption over a wide range of incident angles relative to the planar sample. Note that no anti-reflection coating was used in this experiment.

Figure 7:
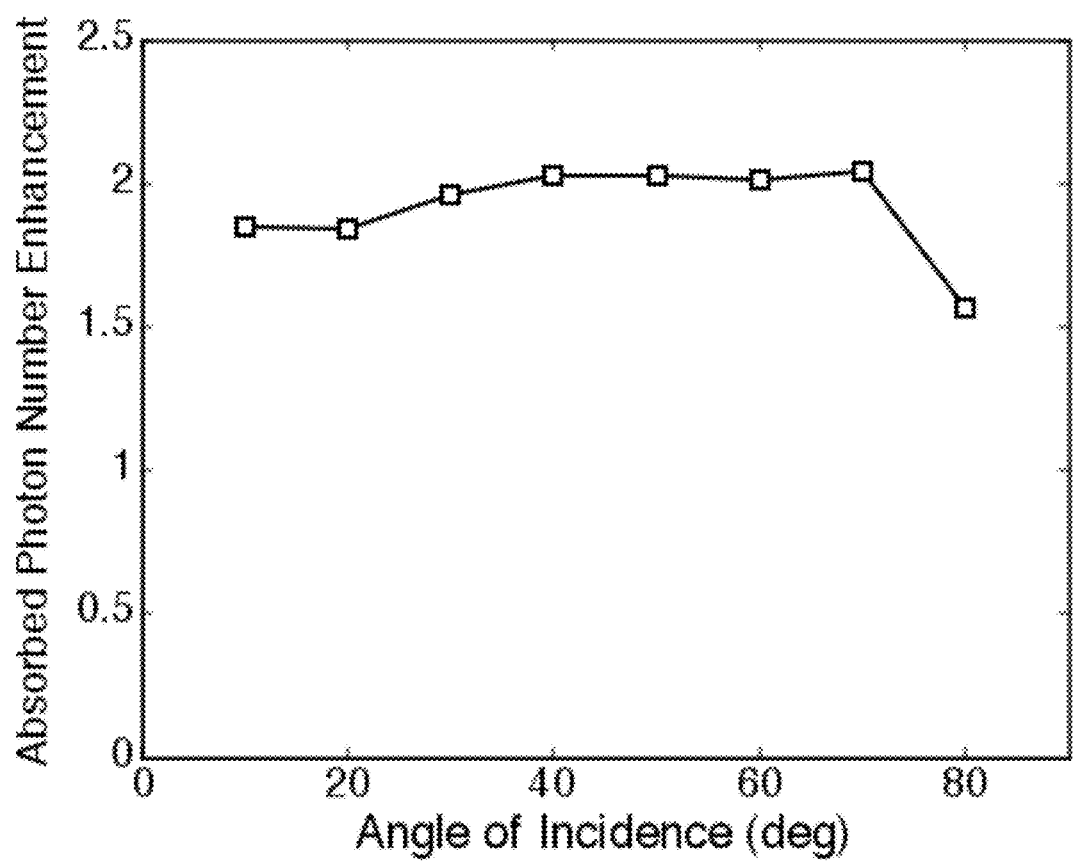
FIG. 7 shows measured angle dependence of integrated absorption in a thin nanostructured film.

This broad angular acceptance is also apparent from integrated absorption (integration from 300 nm to 900 nm using a solar spectrum weighting factor). FIG. 7 shows measured angle dependence of integrated absorption in the above-described thin nanostructured film. Here the ratio 'nano'/'planar' is plotted vs. angle of incidence, showing a significant enhancement of integrated absorption over a wide range of angles.

Another benefit of the use of thin active regions for solar cells is that flexible devices can be considered (e.g., for wearable applications). We have experimentally confirmed that the above described absorption enhancement from nano-structuring remains when the sample structure is flexed.

As indicated above, one of the benefits of having a thin solar cell active region is improved carrier collection efficiency. This effect has been demonstrated by simulations as described below. The approach is to assume different levels of enhanced optical absorption in several solar cells, select the layer thicknesses to provide roughly the same short circuit current ($J_{sc}$), and then compare the resulting open circuit voltages ($V_{oc}$). For all cases, the material is assumed to be silicon, the diffusion length is taken to be 100 µm, the n-doping level is 1e18 cm$^{-3}$, the p-doping level is 1e17 cm$^{-3}$, and surface recombination is neglected.

TABLE 1

|  | cell A | cell B | cell C |
| --- | --- | --- | --- |
| n layer thickness (µm) | 0.1 | 1.0 | 10 |
| p layer thickness (µm) | 1.0 | 10.0 | 90 |
| absorption | x100 | x10 | normal |
| $J_{sc}$ (mA/cm$^2$) | 38.1 | 38.0 | 37.0 |
| $V_{oc}$ (V) | 0.791 | 0.726 | 0.672 |
| $P_{max}$ (mW/cm$^2$) | 25.6 | 23.4 | 20.7 |
| efficiency (%) | 25.6 | 23.4 | 20.7 |
| fill factor | 0.829 | 0.829 | 0.83 |
| efficiency improvement (%) | 23.7 | 13.1 | — |
| $V_{oc}$ improvement (mV) | 119 | 54 | — |

Figure 8:
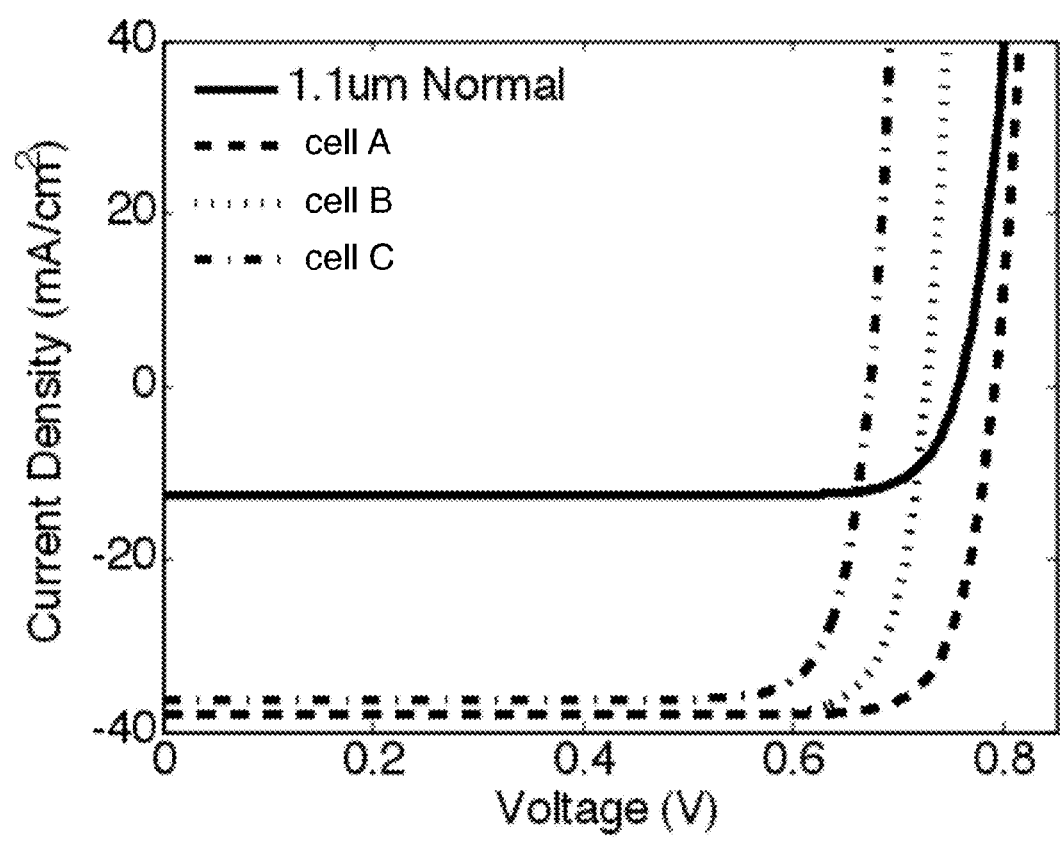
FIG. 8 shows simulated current-voltage curves for various assumed solar cell parameters.

These simulation results are given in Table 1. Here it is apparent that the enhanced absorption devices (i.e., cells A and B) have substantially improved efficiency compared to cell C, which is attributed mainly to the significantly increased open circuit voltage. FIG. 8 shows simulated current-voltage curves for the solar cell parameters of Table 1. In addition, the '1.1 um Normal' curve relates to a simulated solar cell having the parameters of cell A, except for normal absorption rather than 100x enhanced absorption. From FIG. 8, it is apparent that the most significant difference between cells A, B and C is the different open circuit voltages, with thinner cells and greater absorption enhancement improving the open circuit voltage.

Another way to appreciate this point is to consider several solar cells where layer thicknesses are held constant and the only parameter that is varied is the absorption enhancement.

These simulation results are given below in Table 2. From Table 2, it can be seen that 100x (500x) absorption enhancement should give rise to 23% (33%) increase in efficiency, relative to a 100 µm thick conventional silicon solar cell reference device.

TABLE 2

|  | cell A1 | cell A2 | cell A3 | cell A4 | cell A5 |
| --- | --- | --- | --- | --- | --- |
| n layer thickness (µm) | 0.1 | 0.1 | 0.1 | 0.1 | 0.1 |
| p layer thickness (µm) | 1.0 | 1.0 | 1.0 | 1.0 | 1.0 |
| absorption | x500 | x200 | x100 | x50 | x20 |
| $J_{sc}$ (mA/cm$^2$) | 40.9 | 39.5 | 38.1 | 36.1 | 32.4 |
| $V_{oc}$ (V) | 0.793 | 0.792 | 0.791 | 0.789 | 0.786 |
| $P_{max}$ (mW/cm$^2$) | 27.5 | 26.5 | 25.6 | 24.1 | 21.6 |
| efficiency (%) | 27.5 | 26.5 | 25.6 | 24.1 | 21.6 |
| improvement compared to cell C (%) | 32.9 | 28.1 | 23.7 | 17.0 | 4.9 |

The invention claimed is:

1. A solar cell comprising:
    an active region which is a multilayer structure including one or more dense solid layers of crystalline semiconductor stacked on each other; wherein the active region has opposing first and second surfaces that are both nano-structured, and wherein the multilayer structure is a dense solid structure having no voids between the first and second surfaces; and
    a substrate, wherein the active region is disposed on the substrate such that nano-voids are formed between the active region and the substrate;
    wherein the multilayer structure includes at least a p-doped layer and an n-doped layer and is capable of providing electrical power when illuminated.

2. The solar cell of claim 1, wherein the active region comprises a direct gap semiconductor and wherein a total thickness of the active region is less than about 200 nm.

3. The solar cell of claim 1, wherein $L_a$ is a bulk absorption length of the active region, and wherein a total thickness of the active region is less than about $0.1\, L_a$.

4. The solar cell of claim 1, wherein the second surface is nanostructured to have raised pyramidal features, and wherein the first surface is nano-structured to have corresponding pyramidal depressions, whereby hollow nano-pyramids are present in the active region.

5. The solar cell of claim 1, wherein the crystalline semiconductors are selected from the group consisting of: GaAs, direct gap compound semiconductors, direct gap III-V semiconductors, and direct-gap II-VI semiconductors.

6. The solar cell of claim 1, wherein the active region includes a contact zone for making electrical contact to the active region, and wherein the contact zone is laterally adjacent to the nano-structured first and second surfaces of the active region.

7. The solar cell of claim 1, wherein the multilayer structure is a structure selected from the group consisting of: p-n junction, p-i-n junction, single junction photovoltaic structure and multi-junction photovoltaic structure.

8. The solar cell of claim 1, wherein the active region is configured to have corresponding raised features and depressions on opposite surfaces of the active region, whereby hollow nano-structures are present in the active region.

* * * * *